United States Patent
Breitschwerdt et al.

(10) Patent No.: US 7,094,706 B2
(45) Date of Patent: Aug. 22, 2006

(54) DEVICE AND METHOD FOR ETCHING A SUBSTRATE BY USING AN INDUCTIVELY COUPLED PLASMA

(75) Inventors: Klaus Breitschwerdt, Filderstadt (DE); Volker Becker, Marxzell (DE); Franz Laermer, Weil der Stadt (DE); Andrea Schilp, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 365 days.

(21) Appl. No.: 10/763,010

(22) Filed: Jan. 21, 2004

(65) Prior Publication Data

US 2004/0149388 A1   Aug. 5, 2004

Related U.S. Application Data

(62) Division of application No. 09/871,224, filed on May 31, 2001, now Pat. No. 6,709,546.

(30) Foreign Application Priority Data

Oct. 19, 2000   (DE) ................................ 100 51 831

(51) Int. Cl.
*H01L 21/302* (2006.01)
(52) U.S. Cl. ..................... 438/711; 438/728; 438/732
(58) Field of Classification Search ................ 438/711, 438/728, 732
See application file for complete search history.

(56) References Cited

U.S. PATENT DOCUMENTS 6,156,152 A * 12/2000 Ogino et al. ........... 156/345.42

| | | | |
|---|---|---|---|
| 6,189,484 B1 | 2/2001 | Yin et al. | |
| 6,247,425 B1 | 6/2001 | Lymberopoulos et al. | |
| 6,333,269 B1 * | 12/2001 | Naito et al. ................. | 438/706 |
| 6,506,687 B1 * | 1/2003 | Izawa et al. ................. | 438/729 |

FOREIGN PATENT DOCUMENTS

| | | |
|---|---|---|
| DE | 42 41 045 | 5/1994 |
| DE | 197 06 682 | 8/1998 |
| DE | 197 34 278 | 2/1999 |
| DE | 199 00 179 | 2/2000 |
| DE | 199 33 841 | 2/2001 |

* cited by examiner

*Primary Examiner*—Nadine Norton
*Assistant Examiner*—Binh X. Tran
(74) *Attorney, Agent, or Firm*—Kenyon & Kenyon LLP

(57) ABSTRACT

A device and a method for etching a substrate, in particular a silicon body, by using an inductively coupled plasma. A high-frequency electromagnetic alternating field is generated using an ICP source, and an inductively coupled plasma composed of reactive particles is generated by the action of a high-frequency electromagnetic alternating field on a reactive gas in a reactor. In addition, a static or time-variable magnetic field is generated between the substrate and the ICP source, for which purpose at least two magnetic field coils arranged one above the other are provided. The direction of the resulting magnetic field is also approximately parallel to the direction defined by the tie line connecting the substrate and the inductively coupled plasma. Finally, a first component magnetic field is generated with a first magnetic field coil, and a second component magnetic field which is equally strong at an equivalent site is generated with a second magnetic field coil, the two component magnetic fields being oriented in opposite directions.

10 Claims, 1 Drawing Sheet

DEVICE AND METHOD FOR ETCHING A SUBSTRATE BY USING AN INDUCTIVELY COUPLED PLASMA

CROSS-REFERENCE TO RELATED APPLICATION

This application is a divisional of prior application Ser. No. 09/871,224, filed May 31, 2001, now U.S. Pat. No. 6,709,546.

FIELD OF THE INVENTION

The present invention relates to a device and a method for etching a substrate by using an inductively coupled plasma.

BACKGROUND INFORMATION

A device and a method for etching a substrate by using an inductively coupled plasma (ICP), with some areas of the reactor being surrounded by a magnetic field coil for generating a static or time-variable magnetic field in the reactor, is discussed in German Published Patent Application No. 199 33 841. In addition, in an etching method performed using this device, a magnetic field may be generated whose direction may be at least approximately or predominately parallel to a direction defined by the tie line connecting the substrate and the inductively coupled plasma.

SUMMARY OF THE INVENTION

An object of an exemplary embodiment and exemplary method of the present invention is to provide a device and a method with which higher etching rates and an improvement in etching profiles can be achieved.

It is believed that the exemplary device and the exemplary method according to the present invention for etching a substrate have the advantage that much higher or at least higher etching rates can be achieved in anisotropic etching methods for silicon such as those patented in German Patent No. 42 41 045 and German Published Patent Application No. 197 06 682 while achieving the same or even improved quality of the etching results, in particular with regard to the profile shape achieved over the substrate surface.

Using at least two, which may be exactly two or an even number of magnetic field coils arranged one above the other, which may be with electric currents flowing through each pair in opposite directions, is believed to have the advantage that the remote effects of the component magnetic fields thus produced are reduced, and there is a weaker resulting magnetic field at the site of the inductive plasma production and at the site of the substrate than in the case of using just one magnetic field coil. Furthermore, in this way, the component magnetic fields enclosing the plasma may be adjusted in an advantageous manner and thus also to set the resulting total magnetic field to be stronger in the area of the reactor wall.

In particular, the oppositely directed component magnetic fields are produced due to the magnetic field coils with electric current flowing through each pair in opposite directions, which results in that in the proximity of the windings of the magnetic field coils in the interior of the reactor, i.e., in the proximity of the reactor wall, the resulting magnetic field intensity is high and is almost completely unaffected by adjacent coils, while the component magnetic fields generated by the individual magnetic field coils in the interior or in the center of the reactor, in particular in the area of the center of the coil, partially cancel each other out, so that the resulting magnetic field prevailing there is believed to be reduced significantly in comparison with that of just one magnetic field coil.

In addition, it is also believed that the arrangement of such magnetic field coils with current flowing through each pair in opposite directions may advantageously produce the modification of a magnetic lens effect and the development of an almost field-free drift zone in the interior of the reactor between these successive magnetic field coils, i.e., in the vicinity of the connecting plane of adjacent magnetic field coils, so that inhomogeneities from the plasma source area are not reproduced directly on the substrate. Instead, due to the modified lens effect of the coil pairs, this yields the result that the energy input from the plasma is homogenized over the surface of the substrate and an increased energy input can be established at the center of the substrate in comparison with respect the edge of the substrate.

In addition, it is also believed that due to the use of at least two magnetic coils, the magnetic field prevailing at the site of the substrate to be etched can be greatly reduced (or at least reduced) or the magnetic field intensity in the edge area of the interior of the reactor surrounding the substrate can be increased without any (or substantially without any) interference effects.

Due to the arrangement of at least two magnetic field coils according to an exemplary embodiment or exemplary method of the present invention, in particular with current flowing through them in opposite directions, the advantageous effects of a magnetic field with regard to more efficient plasma excitation may be combined with the advantages achieved due to the fact that a weaker and at the same time more homogeneous magnetic field prevails at the site of plasma generation and/or at the site of the substrate to be etched in comparison with the reactor wall and the edge areas than in the case when just one magnetic field coil is used. Furthermore, by using magnetic coils with electric current flowing through them in opposite directions, a device that is continuously adjustable via the coil current is provided, for allowing homogenizing or even "inverting" the energy input from the plasma into a wafer surface. That is, energy input from edge areas of a wafer may be focused into the center of the wafer.

It is also believed to be advantageous if an even number of magnetic field coils are used with current flowing through them in alternating current directions so that the directions of the component magnetic fields generated by the magnetic field coils change from one coil to the next. On the whole, due to the arrangement of the magnetic field coils of the exemplary embodiment or exemplary method of the present invention, this yields first a concentration of the magnetic field on the wall area of the interior of the reactor, i.e., on the inside wall of the spacers, the area of the substrate and the area of the inductively coupled plasma source.

There is also an optimum intensity in the resulting magnetic field intensity in the interior of the reactor, in particular at the center of the magnetic field coils with regard to the increase in plasma efficiency and the etching rates that can be achieved, which is to be determined in each individual case and is in the range of a few milli-Teslas, so it is now possible due to the arrangement of at least two magnetic field coils of the exemplary embodiment or exemplary method of the present invention to optimize the resulting magnetic field intensity in the interior of the reactor, in particular in the drift zone in this regard and at the same time also keep the resulting magnetic field intensity as high as possible or at least relatively high in the area of the reactor wall to ensure "high charge carrier reflection" and good magnetic containment of the plasma.

This may be because oppositely directed component magnetic fields, which may be of equal strength with regard to amplitude at equivalent or corresponding sites are generated by the different magnetic field coils, and the resulting magnetic field decreases with an arrangement of two coils in comparison with just one coil and may actually diminish to zero at the plane of symmetry between the coils. That is, an almost field-free interior area or drift zone over which the plasma can propagate almost without interference is formed between the two magnetic field coils, and at the same time the resulting magnetic field intensity in the vicinity of the reactor wall remains relatively high, so that it effectively prevents electron losses and ion losses in the manner of a magnetic cylinder.

The resulting magnetic field intensity in the interior of the coil is further reduced in this way, namely to a greater extent, the closer one approaches the plane of symmetry between the two magnetic field coils, for example. On the other hand, the resulting magnetic field intensity decreases rapidly at a certain distance from the individual magnetic field coils, i.e., the magnetic field is concentrated at the openings in the coils facing away from one another and on the walls of the reactor, which leads to the above-mentioned magnetic cylinder having a field concentration at the edge and a uniform plasma potential in the interior without any inhomogeneities or interference due to wall interaction effects.

Thus the resulting magnetic field is still sufficiently strong, especially in the vicinity of the outlet openings of the magnetic field coils, in particular the outlet opening of the top magnetic field coil facing the plasma thus generated, to generate plasma much more efficiently than without a magnetic field. Finally, the arrangement of several magnetic field coils here should eliminate the above-mentioned unwanted magnetic lens effect with regard to reproducing plasma inhomogeneities on the substrate, and instead it results in a desired homogenization and focusing of the energy input, which is continuously adjustable over the coil current, onto the center of the wafer, thus leading to more uniform overall etching patterns.

In addition, due to the at least two magnetic field coils arranged one above the other, in particular if they have equal but opposite electric currents flowing through them and/or if two adjacent magnetic field coils generate a first component magnetic field $B$ and a second equally strong component magnetic field $-B'$ but in the opposite direction from the first component magnetic field $B$ with regard to the amplitude of the field strength at an equivalent site, an increasing energy input from the center of the wafer to the edge of the wafer, such as that which would otherwise occur with a plasma etching system using an ICP source and a substrate or wafer arranged beneath it, may be prevented, and a largely homogeneous energy input over the entire wafer surface may be achieved.

This energy input is composed of the product of the ionic energy and the local ionic flux, the energy of the ions being significantly influenceable through the local plasma potential in particular. In the case of available plasma etching systems, the local plasma potential may increase from the center of a wafer to its edge by a few tens of volts, which may have a very negative effect on the uniformity of the etching rate distribution and in particular the profile distribution over the surface of the substrate.

The aperture design referred to in German Patent No. 197 34 278 is believed to influence mainly the ionic flux and its distribution from the center of the wafer to the edge of the wafer. Such an aperture design, however, may have little effect on profile irregularities which are causally related to the incident ionic energy. Furthermore, apertures are mechanically manufactured parts where changes in aperture properties may be achievable only through irreversible machining operations, which may make them inflexible.

However, not only ionic flux but also to a significant extent the plasma potential, i.e., the variation in plasma potential over the surface of the substrate, may be influenced by the arrangement of magnetic field coils of the exemplary embodiment or exemplary method of the present invention and the generation of component magnetic fields directed as explained above and having coordinated amplitudes. In this way, the energy input can therefore be varied to advantage continuously from the center to the edge of the wafer, i.e., it can be focused from edge areas to the center of the wafer by using the inductively coupled plasma on the substrate through the special lens effect of the magnetic field arrangement.

If the plasma etching process is performed entirely without a magnetic field, for example, energy input with a conventional 6" wafer is increased by approximately 3% to 5% at its edge in comparison with the center, which results in a poor etching profile at the edge of the wafer. However, if the two magnetic field coils used of the exemplary embodiment or exemplary method of the present invention receive equal but oppositely directed electric currents of 12 Amperes each, this relationship is reversed by a variable plasma potential, i.e., the energy input at the center of the substrate is approximately 30% higher than at the edge, which now results in profile irregularities such as "beaking" or "profile bow" there which may otherwise occur only in the edge areas of the wafer.

If a coil current of 6 Amperes is used for each coil instead of 12 Amperes, the etching profiles produced at the center and at the edge of the substrate should be almost identical. Finally, a very homogeneous energy input over the entire wafer has been observed when using a current of only 4 to 5 Amperes in each coil, i.e., the etching profiles produced are the same over the entire surface of the wafer.

To this extent, varying the amplitudes of the component magnetic fields generated by the individual magnetic field coils, which can in turn be adjusted very easily on the basis of the current used for each coil, is believed to provide a parameter that is effective and can be controlled very well for controlling or varying the local energy input and in addition the shape of the etching profiles produced over the entire surface of the etched substrate. To this extent, the arrangement of magnetic field coils of the exemplary embodiment or exemplary method of the present invention together with the choice of component magnetic fields of the exemplary embodiment or exemplary method of the present invention acts like a continuously adjustable "aperture."

Moreover, it is also within the scope of the exemplary embodiment or exemplary method of the present invention for the at least two magnetic field coils arranged one above the other to receive independently adjustable but oppositely directed electric currents. In this way, by having the upper magnetic field coil facing the plasma, it is possible to produce an optimal coil field for plasma generation while an optimal coil field for profile uniformity and etching rate is produced with the lower magnetic field coil facing the wafer.

In the case when the substrate to be etched is arranged in the reactor, it is believed to be advantageous if it is arranged symmetrically between the magnetic field coils or, especially advantageously, if the substrate is in a lower area or an output area of a second magnetic field coil, for example, facing away from the plasma. Then the substrate may be arranged in a lower area or an output area of this second magnetic field coil but not inside the approximately cylindrical space defined by the second magnetic field coil. In this connection, it is also believed to be advantageous if the substrate electrode is also within this output area.

It is also believed to be advantageous that due to the arrangement of at least two magnetic field coils arranged one above the other with oppositely directed magnetic fields, a spacer may be associated with each of the magnetic field coils and inserted into the wall of the reactor, the advantages of the device and method referred to in German Published Patent Application No. 199 33 841 may at least be better guaranteed, and the etching results achieved there may even be exceeded significantly with regard to quality. In particular, an etching method having magnetic fields that vary over time, in particular periodically pulsed magnetic fields, may be performed in the context of the exemplary embodiment or exemplary method as referred to in German Published Patent Application No. 199 33 841 even with at least two magnetic field coils arranged one above the other.

DETAILED DESCRIPTION

Figure 1:
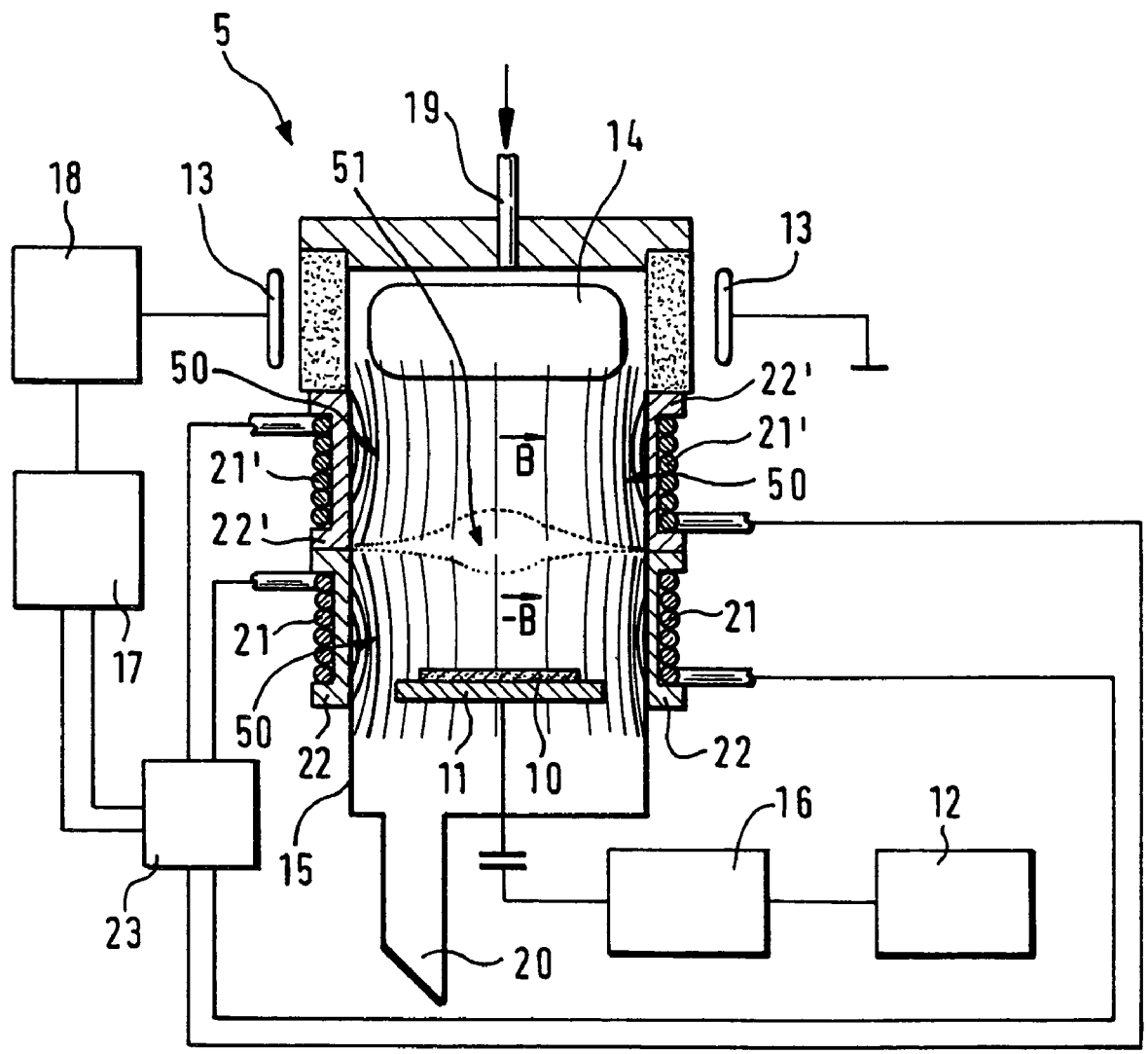
FIG. 1 shows a schematic diagram of a plasma etching system.

The exemplary embodiment or exemplary method of the present invention may use a plasma etching system 5 like the one in German Published Patent Application No. 199 33 841. Specifically, plasma etching system 5 has a reactor 15 in whose upper area an inductively coupled plasma 14 is generated by way of an ICP source 13. The following are also provided here: a gas feed 19 for supplying a reactive gas such as $SF_6$, $ClF_3$, $O_2$, $C_4F_8$, $C_3F_6$, $SiF_4$ or $NF_3$, a gas discharge 20 for removing reaction products, a substrate 10 such as a silicon body or a silicon wafer to be structured by the exemplary etching method according to the present invention, a substrate electrode 11 which is in contact with substrate 10, a substrate voltage generator 12 and a first impedance transformer 16.

Substrate voltage generator 12 also injects an alternating voltage or high frequency power into substrate electrode 11 and above that into substrate 10, causing acceleration of ions generated in inductively coupled plasma 14 onto substrate 10. The high-frequency power or alternating voltage input in this way may be between 3 watts and 50 watts and 5 volts and 100 volts in continuous operation and in pulsed operation respectively, each averaged over time over the pulse sequence.

In addition, there is also an ICP coil generator 17 connected to ICP source 13 via a second impedance transformer 18. The ICP source 13 generates a high-frequency electromagnetic alternating field and also an inductively coupled plasma 14 composed of reactive particles and electrically charged particles (ions) formed by the action of the high-frequency electromagnetic alternating field on the reactive gas in reactor 15. The ICP source 13 has a coil with at least one winding which is placed, for example, on the outside of a tank or on a dielectric plate which is to cover a top magnetic field coil (to be explained below).

A second impedance transformer 18 may be like that referred to in German Patent No. 199 00 179, so that a balanced symmetrical configuration and supply of ICP source 13 over ICP coil generator 17 may be obtained. This should at least better guarantee that the high-frequency alternating voltages applied to the two ends of the coil of ICP source 13 are at least approximately identical to one another and in phase opposition. Furthermore, the center tap of the coil of the ICP source may be grounded.

In FIG. 1, two "spacers" are also arranged one above the other as first spacer 22' and second spacer 22 between inductively coupled plasma 14 and ICP source 13, i.e., the actual plasma excitation zone, and substrate 10. These spacers 22 and 22' are made of aluminum, for example, and are inserted into the wall of reactor 15 in the form of spacer rings. Each may have a height of approximately 5 cm to 30 cm, and may be 15 cm in particular, for a reactor 15 having a diameter of 30 cm to 100 cm. First spacer 22' and second spacer 22 surround a first magnetic field coil 21' and a second magnetic field coil 21 respectively, each magnetic field coil having 100 to 500 windings wound from a copper-clad wire of sufficient size for the amperage to be used.

In addition, copper tubes may also be included in the magnetic field coils 21 and 21' to remove heat losses from magnetic coils 21, 21' via coolant water flowing through these copper tubes. In addition, an electric current of 1 to 100 A, for example, in particular 1 A to 15 A, especially 3 A to 10 A is conducted by magnetic field coils 21, 21' via a power supply unit 23. The electric current passes through second magnetic field coil 21 in the opposite direction from that passing through first magnetic field coil 21', so that two oppositely directed component magnetic fields ($\vec{B}$, $-\vec{B}'$) are formed in the inside of reactor 15.

The amperages through first magnetic field coil 21' and second magnetic field coil 21 may be selected so that the amplitudes of the field intensities of the two component magnetic fields are the same at corresponding sites in the interior of reactor 15. This should result in an almost field-free drift zone 51 of the plasma 14 generated in the interior or reactor 15, while a relatively high magnetic field should prevail in the vicinity of reactor wall 50.

In the "simplest" case, the currents through magnetic field coils 21, 21' are direct currents which generate, in the interior of reactor 15, a static magnetic field that produces a magnetic field intensity of approximately 1 mT to 20 mT, for example, at the center of magnetic field coils 21 and 21'.

Moreover, substrate 10 having substrate electrode 11 connected to it is arranged in a lower area or output area of second magnetic field coil 21 facing away from plasma 14. It should be ensured here that substrate 10 is still within the space defined by second magnetic field coil 21. As an alternative, however, substrate 10 may also be arranged symmetrically between two magnetic field coils 21 and 21', the two component magnetic fields ($\vec{B}$, $-\vec{B}'$) largely canceling one another out due to their opposite directions, i.e., substrate 10 having substrate electrode 11 is in drift zone 51 or in an almost magnetic field-free space. On the other hand, the prevailing magnetic fields in the area of reactor wall 50 cylindrically surrounding substrate 10 are also strong enough in this configuration, e.g., 10 mT to 20 mT (milli-Tesla), to effectively suppress a plasma-wall interaction and thus interference in the plasma potential.

It is also believed to be especially advantageous for both substrate 10 and substrate electrode 11 connected to it to be arranged so that they are exposed at least to a slight extent to the component magnetic field ($-\vec{B}'$) of second magnetic field coil 21 facing away from plasma 14. It should also be emphasized that the magnetic fields generated by magnetic field coils 21, 21' are at least approximately parallel to the direction defined by the tie line connecting substrate 10 and inductively coupled plasma 14.

With regard to additional details concerning the etching method carried out with plasma etching installation 5 described here as well as additional details regarding plasma etching installation 5 which go beyond the feature of providing at least two magnetic field coils with the amplitudes, directions and orientations of the component magnetic fields explained here as well as the arrangement of substrate 10 and substrate electrode 11 in reactor 15 as explained here, German Published Patent Application No. 199 33 841 is referred to and/or incorporated by reference as necessary.

What is claimed is:

1. A method for etching at least one of a substrate and a silicon body using an inductively coupled plasma generated by a device, the device including an ICP source for generating a high-frequency electromagnetic alternating field, a reactor for generating the inductively coupled plasma composed of reactive particles by an action of the high-frequency electromagnetic alternating field on a reactive gas, and an arrangement for generating one of a static magnetic field and a time-variable magnetic field between the ICP source and the at least one of the substrate and the silicon body, the arrangement having at least two magnetic field coils arranged one above the other, wherein at least one of the static magnetic field, the time-variable magnetic field, and a pulsed magnetic field whose direction is at least approximately parallel to a direction defined by a tie line connecting the at least one of the substrate and the silicon body and the inductively coupled plasma is generatable using the at least two magnetic field coils, the method comprising the steps of:

generating a first component magnetic field using a first magnetic field coil of the at least two magnetic field coils; and generating a second component magnetic field using a second magnetic field coil of the at least two magnetic field coils;

wherein the first component magnetic field and the second component magnetic field are oriented in opposite directions from one another.

2. The method of claim 1, wherein the first component magnetic field and the second component magnetic field have a same amplitude of a field intensity at an equivalent site.

3. The method of claim 1, further comprising the step of pulsing the first component magnetic field and the second component magnetic field simultaneously and synchronously with one another, the pulsing occurring synchronously with a high-frequency power injected into the at least one of the substrate and the silicon body.

4. The method of claim 1, wherein the first component magnetic field and the second component magnetic field are each generated with a field strength amplitude in a range of between 1 milli-Tesla and 100 milli-Tesla in an interior of the reactor.

5. The method of claim 4, wherein the range is between 1 milli-Tesla and 5 milli-Tesla.

6. The method of claim 1, wherein the first component magnetic field and the second component magnetic field are each generated with a field strength amplitude in a range of between 10 milli-Tesla and 100 milli-Tesla in an interior of the reactor and in a vicinity of a reactor wall.

7. The method of claim 6, wherein the range is between 10 milli-Tesla and 30 milli-Tesla.

8. The method of claim 1, wherein at least one of the first component magnetic field and the second component magnetic field is generated as a pulsed component magnetic field by using at least one power supply unit.

9. The method of claim 8, wherein at least one of the first component magnetic field and the second component magnetic field are pulsed at a frequency of 10 Hz to 20 kHz to establish a pulse/pause ratio of 1:1 to 1:100.

10. The method of claim 8, wherein a pulsing is one of correlated in time and synchronized with at least one of a first pulsing of an input plasma power and a second pulsing of a high-frequency power injectable into the at least one of the substrate and the silicon body by a substrate voltage generator.

* * * * *